(12) United States Patent
Loccufier et al.

(10) Patent No.: US 9,562,129 B2
(45) Date of Patent: Feb. 7, 2017

(54) (ETHYLENE, VINYL ACETAL) COPOLYMERS AND THEIR USE IN LITHOGRAPHIC PRINTING PLATE PRECURSORS

(71) Applicant: AGFA GRAPHICS NV, Mortsel (BE)

(72) Inventors: Johan Loccufier, Mortsel (BE); Philippe Moriame, Mortsel (BE)

(73) Assignee: AGFA GRAPHICS NV, Mortsel (BE)

( * ) Notice: Subject to any disclaimer, the term of this patent is extended or adjusted under 35 U.S.C. 154(b) by 0 days.

(21) Appl. No.: 14/654,644

(22) PCT Filed: Dec. 3, 2013

(86) PCT No.: PCT/EP2013/075366
§ 371 (c)(1),
(2) Date: Jun. 22, 2015

(87) PCT Pub. No.: WO2014/106554
PCT Pub. Date: Jul. 10, 2014

(65) Prior Publication Data
US 2015/0315326 A1 Nov. 5, 2015

Related U.S. Application Data

(60) Provisional application No. 61/748,133, filed on Jan. 2, 2013.

(30) Foreign Application Priority Data

Jan. 1, 2013 (EP) .................................... 13150001

(51) Int. Cl.
G03F 7/00 (2006.01)
C08G 4/00 (2006.01)
B41C 1/10 (2006.01)
C09D 129/14 (2006.01)
G03F 7/039 (2006.01)

(52) U.S. Cl.
CPC ............... C08G 4/00 (2013.01); B41C 1/1008 (2013.01); B41C 1/1016 (2013.01); C09D 129/14 (2013.01); B41C 2210/02 (2013.01); B41C 2210/06 (2013.01); B41C 2210/24 (2013.01); G03F 7/039 (2013.01)

(58) Field of Classification Search
CPC .................................................. B41C 2210/02
See application file for complete search history.

(56) References Cited

U.S. PATENT DOCUMENTS 2,462,151 A * 2/1949 Woodward ............... G03C 1/93
430/536
3,929,488 A 12/1975 Smith
5,169,897 A 12/1992 Walls
5,262,270 A 11/1993 Walls
5,330,877 A 7/1994 Curtis
5,534,381 A 7/1996 Ali et al.
6,087,066 A 7/2000 Baumann et al.
6,255,033 B1 7/2001 Levanon et al.
6,270,938 B1 8/2001 Gandini et al.
6,458,503 B1 10/2002 Platzer et al.
(Continued)

FOREIGN PATENT DOCUMENTS

EP 0 934 822 A1 8/1999
EP 1 072 432 A2 1/2001
(Continued)

OTHER PUBLICATIONS

Official Communication issued in International Patent Application No. PCT/EP2013/075366, mailed on Jan. 14, 2014.

Primary Examiner — Chanceity Robison
(74) Attorney, Agent, or Firm — Keating and Bennett, LLP

(57) ABSTRACT

A copolymer includes (i) a plurality of ethylenic moieties A having a structure according to the following formula:

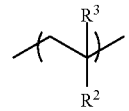

wherein $R^2$ and $R^3$ independently represent hydrogen, a halogen, or an optionally substituted linear, branched, or cyclic alk(en)yl group, or an optionally substituted aromatic or heteroaromatic, and (ii) a plurality of acetal moieties B having a structure according to the following formula:

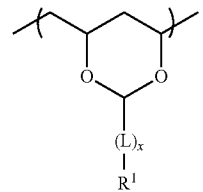

wherein L represents a divalent linking group; x=0 or 1; and $R^1$ represents an optionally substituted aromatic or heteroaromatic group including at least one hydroxyl group. Use of these polymers in the coating of lithographic printing plates provides a good abrasion resistance while the balance between the ink acceptance, arising from the ethylenic moieties, and the solubility in an alkaline developer, arising form the acetal moieties, can be controlled efficiently.

14 Claims, No Drawings

(56) References Cited

U.S. PATENT DOCUMENTS

| | | |
|---|---|---|
| 6,458,511 B1 | 10/2002 | Wittig et al. |
| 6,541,181 B1 | 4/2003 | Levanon et al. |
| 6,596,456 B2 | 7/2003 | Baumann et al. |
| 6,596,460 B2 | 7/2003 | Timpe et al. |
| 6,783,913 B2 | 8/2004 | Glatt et al. |
| 6,818,378 B2 | 11/2004 | Endo |
| 2003/0166750 A1 | 9/2003 | Koletar et al. |
| 2004/0081662 A1 | 4/2004 | Hermand et al. |
| 2005/0003296 A1 | 1/2005 | Memetea et al. |
| 2006/0130689 A1 | 6/2006 | Muller et al. |
| 2009/0004599 A1 | 1/2009 | Levanon et al. |
| 2009/0291387 A1 | 11/2009 | Levanon et al. |
| 2010/0047723 A1 * | 2/2010 | Levanon ............... B41C 1/1008 430/325 |
| 2011/0059399 A1 | 3/2011 | Levanon et al. |

FOREIGN PATENT DOCUMENTS

| | | |
|---|---|---|
| EP | 1 162 209 A1 | 12/2001 |
| EP | 1 627 732 A1 | 2/2006 |
| WO | 99/01795 A2 | 1/1999 |
| WO | 01/09682 A2 | 2/2001 |
| WO | 02/073315 A1 | 9/2002 |
| WO | 02/096961 A1 | 12/2002 |
| WO | 03/079113 A1 | 9/2003 |
| WO | 2004/020484 A1 | 3/2004 |
| WO | 2004/081662 A2 | 9/2004 |
| WO | 2007/003030 A1 | 1/2007 |
| WO | 2007/017162 A2 | 2/2007 |
| WO | 2008/103258 A1 | 8/2008 |
| WO | 2009/005582 A1 | 1/2009 |
| WO | 2009/085093 A1 | 7/2009 |
| WO | 2009/099518 A1 | 8/2009 |

* cited by examiner

(ETHYLENE, VINYL ACETAL) COPOLYMERS AND THEIR USE IN LITHOGRAPHIC PRINTING PLATE PRECURSORS

CROSS-REFERENCE TO RELATED APPLICATIONS

This application is a 371 National Stage Application of PCT/EP2013/075366, filed Dec. 3, 2013. This application claims the benefit of U.S. Provisional Application No. 61/748,133, filed Jan. 2, 2013, which is incorporated by reference herein in its entirety. In addition, this application claims the benefit of European Application No. 13150001.9, filed Jan. 1, 2013, which is also incorporated by reference herein in its entirety.

BACKGROUND OF THE INVENTION

1. Field of the Invention

The present invention relates to (ethylene, vinyl acetal) copolymers and to lithographic printing plate precursors including such copolymers.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of an imaging material called plate precursor. The coating of the precursor is exposed image-wise to heat or light, typically by means of a digitally modulated exposure device such as a laser, which triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular plate precursors require wet processing since the exposure produces a difference of solubility or of rate of dissolution in a developer between the exposed and the non-exposed areas of the coating. In positive working plates, the exposed areas of the coating dissolve in the developer while the non-exposed areas remain resistant to the developer. In negative working plates, the non-exposed areas of the coating dissolve in the developer while the exposed areas remain resistant to the developer. Most plates contain a hydrophobic coating on a hydrophilic support, so that the areas which remain resistant to the developer define the ink-accepting, printing areas of the plate while the hydrophilic support is revealed by the dissolution of the coating in the developer at the non-printing areas.

Many lithographic printing plates contain polymeric binders such as phenolic resins which can be baked in order to increase the run length on the press. Over the last few years, printing plate materials which provide a high run length without baking have become more popular because the post-bake oven can be eliminated leading to reduced energy consumption and less floor space. The trend towards higher printing speeds on web presses and the use of recycled paper require plate coatings that are characterised by a high abrasion resistance. Unbaked phenolic resins such as novolac, resol or poly(vinyl phenol) have a poor abrasion resistance and cannot provide a high run length in such conditions.

In the prior art, the run length of lithographic printing plates based on phenolic resins has been improved by chemical modification of such binders. Examples thereof are described in for example WO 99/01795, EP 934 822, EP 1 072 432, U.S. Pat. No. 3,929,488, EP 2 102 443, EP 2 102 444, EP 2 102 445 and EP 2 102 446. Phenolic resins have also been mixed with or replaced by other polymers such as poly(vinyl acetal) resins in order to improve the abrasion resistance of the coating. Suitable poly(vinyl acetal) resins are described in U.S. Pat. No. 5,262,270; U.S. Pat. No. 5,169,897; U.S. Pat. No. 5,534,381; U.S. Pat. No. 6,458,511; U.S. Pat. No. 6,541,181; U.S. Pat. No. 6,087,066; U.S. Pat. No. 6,270,938; WO 2001/9682; EP 1 162 209; U.S. Pat. No. 6,596,460; U.S. Pat. No. 6,596,460; U.S. Pat. No. 6,458,503; U.S. Pat. No. 6,783,913; U.S. Pat. No. 6,818,378; U.S. Pat. No. 6,596,456; WO 2002/73315; WO 2002/96961; U.S. Pat. No. 6,818,378; WO 2003/79113; WO 2004/20484; WO 2004/81662; EP 1 627 732; WO 2007/17162; WO 2008/103258; U.S. Pat. No. 6,087,066; U.S. Pat. No. 6,255,033; WO 2009/5582; WO 2009/85093; WO 2001/09682; US 2009/4599; WO 2009/99518; US 2006/130689; US 2003/166750; U.S. Pat. No. 5,330,877; US 2004/81662; US 2005/3296; EP 1 627 732; WO 2007/3030; US 2009/0291387; US 2010/47723 and US 2011/0059399.

Poly(vinyl acetals) are typically prepared by acetalisation of poly(vinyl alcohol) with aldehydes. Poly(vinyl acetals) used for lithographic printing plate coatings typically comprise both a hydrophobic acetal moiety, which provides the ink-acceptance, and an hydroxyl substituted aromatic acetal moiety, which produces the solubility differentiation in an alkaline developer upon exposure.

Such poly(vinyl acetals) are typically prepared by the acetalisation of poly(vinyl alcohol) with a mixture of aldehydes, e.g. an aliphatic aldehyde such as butyraldehyde mixed with a phenolic aldehyde such as hydroxybenzaldehyde. The physical and chemical properties of such poly (vinyl acetal) resins are highly dependent on the degree of acetalysation, the ratio of the aliphatic and the aromatic acetal moieties, the stereochemistry and the random or block nature of the acetal resin. Small shifts in process conditions during the preparation of the known acetal resins may produce significant differences in the structure of the obtained resin and thus in significant differences of their properties. For example, incomplete dissolution of the poly (vinyl alcohol) reagent may lead to an irreproducible degree of conversion, i.e. a lack of control of the composition of the final product. Also the competition and the transacetylisation which often occurs between the mixed aldehyde reagents is difficult to control so that the right balance between the hydrophobicity of the resin and its solubility in an alkaline developer cannot always be obtained.

SUMMARY OF THE INVENTION

It is therefore an object of the present invention to provide poly(vinyl acetal) resins which are suitable for lithographic plate making and which have the known advantages of this class of polymers such as a high abrasion resistance but which are intrinsically less susceptible to process conditions during their preparation. A preferred embodiment is realised by the (ethylene, vinyl acetal) copolymer defined below, of which the hydrophobicity is defined by ethylenic moieties in the backbone of the polymer which can be controlled independently from the acetal moieties. In the coating of lithographic printing plates these polymers provide an improved sensitivity and abrasian resistance compared to poly(vinyl acetal) resins of the prior art while the balance between the ink acceptance, arising from the ethylenic moieties, and the solubility in an alkaline developer, arising form the acetal moieties, can be controlled efficiently.

The (ethylene, vinyl acetal) copolymer comprises (i) a plurality of ethylenic moieties A having a structure according to the following formula:

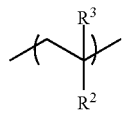

wherein $R^2$ and $R^3$ independently represent hydrogen, a halogen or an optionally substituted linear, branched or cyclic alk(en)yl group, or an optionally substituted aromatic group or heteroaromatic group, and (ii) a plurality of acetal moieties B having a structure according to the following formula:

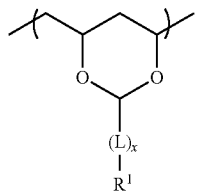

wherein
L represents a divalent linking group;
X=0 or 1; and
$R^1$ represents an optionally substituted aromatic or heteroaromatic group including at least one hydroxyl group.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE PREFERRED EMBODIMENTS

The poly(vinyl acetal) resin of a preferred embodiment of the present invention is a copolymer comprising a plurality of ethylenic moieties A and a plurality of acetal moieties B. The term "ethylenic moiety" is generally understood as the monomeric unit—i.e. the building block making up the polymer—obtained after polymerisation of optionally substituted ethylene. The ethylenic moieties comprise —$CH_2$—$CH_2$— as well as mono- and/or di-substituted derivatives thereof. The poly(vinyl acetal) resin is further also referred to herein as the "(ethylene, vinyl acetal) copolymer".

The (ethylene, vinyl acetal) copolymer may be a random or a block-copolymer. In the latter embodiment, the copolymer may include alternating sequences of blocks consisting of the ethylenic moieties A and blocks consisting of the acetal moieties B. Such blocks may range from small blocks, e.g. comprising less than 5 moieties—i.e. 1, 2, 3, 4 or 5 moieties—up to blocks comprising 100 moieties or more. Preferably, the blocks including the ethylenic moieties A and blocks including the acetal moieties B independently include about 10 to 90, 15 to 80 or 20 to 60 ethylenic moieties. The moieties A may be all the same or different. Likewise, the moieties B may be all the same or different.

The acetal moieties B have a structure according to the following formula:

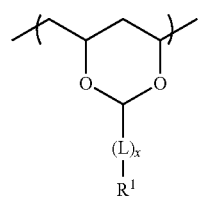

wherein
L represents a divalent linking group;
X=0 or 1; and
$R^1$ represents an aromatic or heteroaromatic group including at least one hydroxyl group and optionally one or more additional substituent(s). The hydroxyl group(s) may be in ortho, meta and/or para-position on the ring. Suitable examples of the aromatic group include a phenyl, benzyl, tolyl, ortho- meta- or para-xylyl group, naphtyl, anthracenyl, phenanthrenyl group and/or combinations thereof, which may contain, besides the at least one hydroxyl group, further optional substituents. The heteroaromatic group is preferably selected from an optionally substituted furyl, pyridyl, pyrimidyl, pyrazoyl, thiofenyl group and/or combinations thereof, all including at least one hydroxyl group.

In the definition of $R^1$, the optional substituents on the aromatic or heteroaromatic group may be selected from additional hydroxy substituents, an alkyl group such as a methyl or ethyl group, an alkoxy group such as a methoxy or an ethoxy group, an aryloxy group, a thioalkyl group, a thioaryl group, —SH, an azo group such as an azoalkyl or azoaryl group, a thioalkyl, amino, ethenyl, phenyl, alkyl, alkenyl, alkynyl, cycloalkyl, aryl, heteroaryl or heteroalicyclic group and/or combinations thereof.

Preferably, $R^1$ is an optionally substituted phenol or naphthol group such as an optionally substituted 2-, 3- or 4-hydroxyphenyl group, a 2,3-, 2,4-, 2,5-dihydroxyphenyl, a 1,2,3-trihydroxyphenyl or a hydroxynaphthyl group. More preferably, $R^2$ is an optionally substituted phenol group. The optional substitutents are preferably an alkoxy group such as a methoxy or an ethoxy group.

The divalent linking group L is preferably selected from an optionally substituted alkylene, arylene or heteroarylene, —O—, —CO—, —CO—O—, —O—CO—, —CO—NH—, —NH—CO—, —NH—CO—O—, —O—CO—NH—, —NH—CO—NH—, —NH—CS—NH—, —SO—, —$SO_2$—, CH=N, —NH—NH— and/or combinations thereof. The substituents optionally present on the alkylene, the arylene or the heteroarylene group may be represented by an alkyl group, a hydroxyl group, an amino group, a (di)alkylamino group, an alkoxy group, a phosponic acid group or a salt thereof. More preferably, the divalent linking group L represents an optionally substituted alkylene, arylene or heteroarylene. Most preferably, L represents —CH₂—, —CH₂—CH₂—, —CH₂—CH₂—CH₂— or a phenylene group.

In a highly preferred embodiment, the acetal moieties B have a structure according to the following formula:

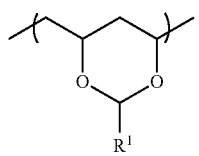

wherein R¹ is as defined above.

The ethylenic moieties A have a structure according to the following formula:

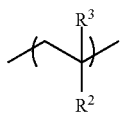

wherein $R^2$ and $R^3$ independently represent hydrogen, a halogen such as chloro, bromo or iodo group, or an optionally substituted linear, branched or cyclic alk(en)yl group—i.e. an alkyl or alkenyl group—or an optionally substituted aromatic group or an optionally substituted heteroaromatic group. Examples of the alkyl group are a methyl, ethyl, n-propyl, n-butyl, n-pentyl, n-hexyl, chloromethyl, trichloromethyl, iso-propyl, iso-butyl, iso-pentyl, neo-pentyl, 1-methylbutyl and iso-hexyl, cyclopropyl, cyclobutyl, cyclopentyl, cyclohexyl and methylcyclohexyl group. Examples of the alkenyl group are ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group. The halogen is preferably a chloro group. The aromatic group is preferably selected from an optionally substituted aryl group such as a phenyl, benzyl, tolyl or an ortho- meta- or para-xylyl group, an optionally substituted naphtyl, anthracenyl, phenanthrenyl, and/or combinations thereof. The heteroaromatic group is preferably selected from an optionally substituted furyl, pyridyl, pyrimidyl, pyrazoyl or thiofenyl group and/or combinations thereof. Preferably, $R^2$ and $R^3$ independently represent hydrogen, a chloro group or a methyl group. In a most preferred embodiment, $R^2$ and $R^3$ represent hydrogen.

The optional substituents on the linear, branched or cyclic alk(en)yl group and on the aromatic or heteroaromatic group may be selected from an alkoxy group such as a methoxy or an ethoxy group, a thioalkyl group, —SH, and/or a combinations thereof. The optional substituents on the aromatic or heteroaromatic group may further be selected from an aryloxy group, a thioaryl group, an azo group such as an azoalkyl or azoaryl group, an amino group and/or a combinations thereof.

In a highly preferred embodiment, the ethylenic moieties A have a structure according to the following formula:

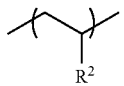

wherein R² is as defined above.

Preferably the (ethylene, vinyl acetal) copolymer comprises ethylenic moieties A as defined above in an amount of at least 10 mol %, preferably in a range from 10 to 55 mol %, more preferably in a range from 15 to 45 mol %, and most preferably in a range from 20 to 35 mol %. The acetal moieties B as defined above are preferably present in an amount of at least 15 mol %, preferably in a range from 15 to 60 mol %, more preferably in a range from 20 to 50 mol %, and most preferably in a range from 25 to 45 mol %. All amounts of the moieties, expressed herein as mol %, refer to the sum of all monomeric units of the copolymer.

In a preferred embodiment, the sum of the amounts of all the moieties A and of all the moieties B in the copolymer ranges from 50 to 90 mol %, more preferably from 60 to 80 mol %, and most preferably from 65 to 75 mol %.

The (ethylene, vinyl acetal) copolymer may comprise other monomeric units besides moieties A and B as defined above. The copolymer may for example further comprise optionally substituted vinyl alcohol, referred to herein as moieties C, and/or moieties D represented by the following formula:

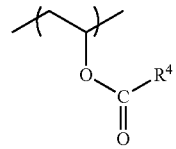

wherein R⁴ represents hydrogen, or an optionally substituted linear, branched or cyclic alkyl group such as a methyl, ethyl, n-propyl, n-butyl, n-pentyl, n-hexyl, chloromethyl, trichloromethyl, iso-propyl, iso-butyl, iso-pentyl, neo-pentyl, 1-methylbutyl and iso-hexyl cyclopropyl, cyclobutyl, cyclopentyl, methyl cyclohexyl, cyclohexyl group, an optionally substituted aromatic group or an optionally substituted heteroaromatic group. In a preferred embodiment, R⁴ is an optionally substituted alkyl group, most preferably methyl.

In the above definition of R⁴, the optional substituents on the linear, branched or cyclic alkyl group and the aromatic or heteroaromatic group may be selected from an alkoxy group such as a methoxy or an ethoxy group, a thioalkyl group, —SH, and/or a combinations thereof. The optional substituents on the aromatic or heteroaromatic group may further be selected from an aryloxy group, a thioaryl group, an azo group such as an azoalkyl or azoaryl group, an amino group, and/or a combinations thereof.

The amount of vinyl alcohol moieties C is preferably from 10 to 60 mol %, more preferably from 15 to 50 mol %, and most preferably from 20 to 30 mol %. The amount of moieties D is preferably between 0 and 10 mol %. Preferably the amount of moieties D is less than 8 mol %, more preferably less than 3 mol % and most preferably less than 1 mol %.

In a preferred embodiment of the present invention, the (ethylene, vinyl acetal) copolymer is represented by the general formula:

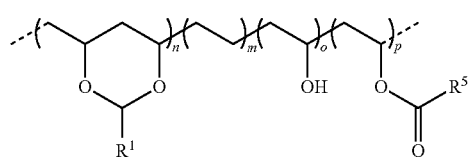

wherein R¹ is as defined above and R⁵ is an optionally substituted alkyl group, preferably methyl;

m=10 to 55 mol %, more preferably 15 to 45 mol %, and most preferably 20 to 35 mol %;

n=15 to 60 mol %, more preferably 20 to 50 mol %, and most preferably 25 to 45 mol %;

o=10 to 60 mol %, more preferably 15 to 50 mol %, and most preferably 20 to 30 mol %; and p=0 to 10 mol %, more preferably less than 3 mol % and most preferably less than 1 mol %.

The numeric average molecular weight (Mn) of the copolymers ranges preferably from 15000 to 250000, more preferably from 25000 to 200000 and most preferably from 35000 to 150000. The weight average molecular weight (Mw) of the copolymers ranges preferably from 50000 to 350000, more preferably from 70000 to 325000 and most preferably from 100000 to 300000. The numeric average molecular weight (Mn) and the weight average molecular weight (Mw) are each determined by size exclusion chromatography.

The copolymer can, besides moieties A, B, C and D discussed above, contain further monomeric units as disclosed in U.S. Pat. No. 5,169,897, WO 1993/3068, U.S. Pat. No. 5,534,381, U.S. Pat. No. 5,698,360, JP 11-212252, JP 11-231535, JP 2000-039707, JP 2000-275821, JP 2000-275823, U.S. Pat. No. 6,087,066, WO 2001/9682, U.S. Pat. No. 6,270,938, U.S. Pat. No. 6,596,460, WO 2002/73315, WO 2002/96961, U.S. Pat. No. 6,818,378, WO 2004/20484, WO 2007/3030, WO 2009/5582 or WO 2009/99518.

The copolymers described herein can be prepared using known reagentia and reaction conditions including those described in U.S. Pat. No. 6,541,181, U.S. Pat. No. 4,665,124, U.S. Pat. No. 4,940,646, U.S. Pat. No. 5,169,898, U.S. Pat. No. 5,700,619, U.S. Pat. No. 5,792,823, U.S. Pat. No. 5,849,842, WO 93/03068, DE 10011096; DE 3404366, U.S. Ser. No. 09/751,660, WO 01/09682, WO 03/079113, WO 2004/081662, WO 2004/020484, WO 2008/103258, and in JP 09-328,519.

Suitable polymers which can be used as starting material are copolymers of optionally substituted ethylene and vinyl alcohol. Acetalisation of two neighbouring vinyl alcohol units thereof with an aldehyde produces acetal moieties B.

Examples of such aldehydes are e.g. phenolic aldehydes such as o-hydroxybenzaldehyde, 4,6-dibromo-2-formylphenol, 3,5-dichlorosalicylaldehyde, 2,4-dihydroxybenzaldehyde, 3-methoxysalicyladehyde, 6-hydroxysalicylaldehyde, phloroglucinaldehyde, m-hydroxybenzaldehyde, 3,4-dihydroxy-benzaldehyde, 4-ethoxy-3-hydroxy-benzaldehyde, p-hydroxybenzaldehyde, syringaldehyde, 4-hydroxy-3,5-di-tert-butylbenzaldehyde, 6-hydroxy-isophthalaldehydic acid and 1-hydroxy-2-anthraquinonecarboxaldehyde; naphthol aldehydes such as 2-hydroxy-1-naphthalenealdehyde, 4-hydroxy-1-naphthalenecarbaldehyde, 1-hydroxy-2-naphthaldehyde, 6-hydroxy-2-naphthaldehyde and 1,6,7-trihydroxy-2-naphthalenecarbox-aldehyde; or antracenol aldehydes such as 1,3-dihydroxy-2-anthracenecarboxaldehyde and 2-hydroxy-1-anthracenecarboxaldehyde.

This acetalization reaction generally requires addition of a strong inorganic or organic catalyst acid. Examples of catalyst acids are hydrochloric acid, sulfuric acid, phosphoric acid, p-toluenesulfonic acid, alkylsulfonic acid, perfluoroalkylsulfonic acid and other perfluoro-activated acids. The amount of acid added to the reaction mixture should allow effective protonation of the reagens but should not significantly alter the final product by causing unwanted hydrolysis of the acetal groups. The applied reaction temperature is preferably between 0° C. and the boiling point of the solvent and depends on the kind of reagens and on the desired level of substitution. The reaction product obtained often remains in solution even if the initial poly(ethylene, vinyl alcohol) reagent is not completely dissolved. Organic solvents as well as mixtures of water with organic solvents are used for the reaction. Incomplete dissolution of the poly(ethylene, vinyl alcohol) reagent is a disadvantage that may lead to an irreproducible degree of conversion. Therefore, in order to obtain reproducible products, solvents which allow complete dissolution of the initial poly(ethylene, vinyl alcohol) reagent in the reaction mixture are preferred. Suitable organic solvents are alcohols (such as methanol, ethanol, propanol, butanol, and glycol ether), cyclic ethers (such as 1,4-dioxane), and dipolar aprotic solvents (such as N,N-dimethylformamid, N-methyl pyrrolidone or dimethyl sulfoxide). The finished products may be isolated as a solid, by introducing the reaction mixture into a non-solvent under vigorous stirring, followed by filtering and drying. Water is especially suitable as a non-solvent for the polymers. Unwanted hydrolysis of the acetal group containing a hydroxyl-substituted aromatic group takes place much easier than for the acetal groups containing an aliphatic or non-substituted aromatic group. The presence of small amounts of water in the reaction mixture may lead to a decreased degree of acetalization and incomplete conversion of the aromatic hydroxy aldehyde used. In the absence of water, the hydroxy-substituted aromatic aldehydes react with hydroxyl groups of alcohols immediately and with almost 100% conversion. Therefore, it is desirable to remove the water from the reaction mixture during the reaction by for example distillation under reduced pressure. In addition, the remaining water may be removed by adding organic compounds to the reaction mixture which form volatile materials and/or inert compounds upon reaction with water. These organic compounds may be chosen from e.g. carbonates, orthoesters of carbonic or carboxylic acids such as diethylcarbonate, trimethyl orthoformate, tetraethyl carbonate, and tetraethyl silicate such as silica-containing compounds. The addition of these materials to the reaction mixture typically leads to 100% conversion of the used aldehydes.

Specific examples of copolymers according to preferred embodiments of the present invention are given in the following Table:

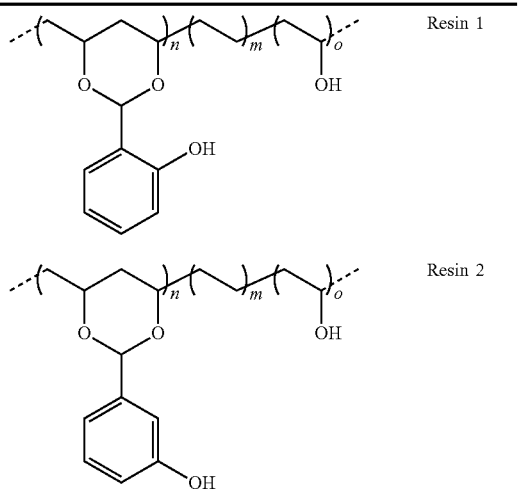

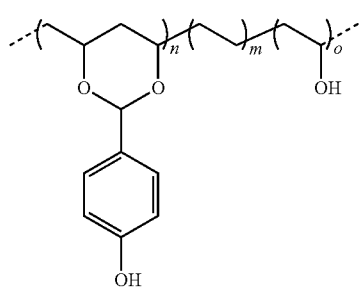
Resin 3
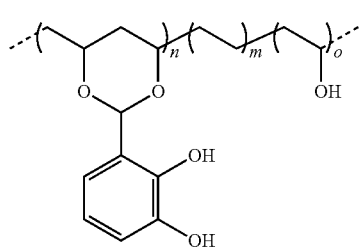
Resin 4
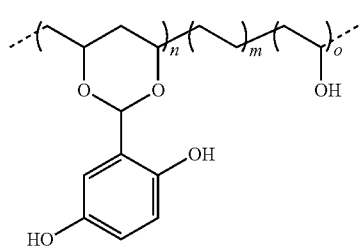
Resin 5
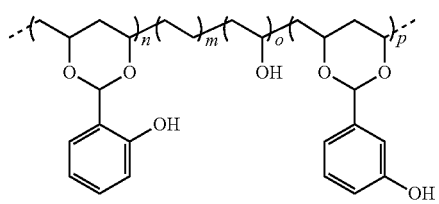
Resin 6
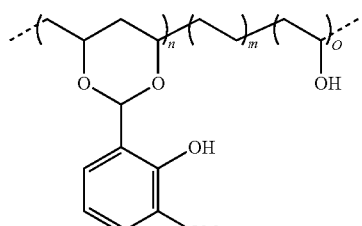
Resin 7
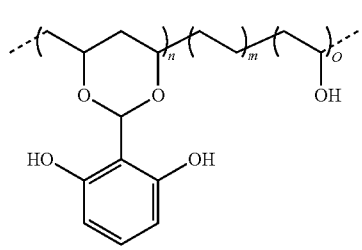
Resin 8
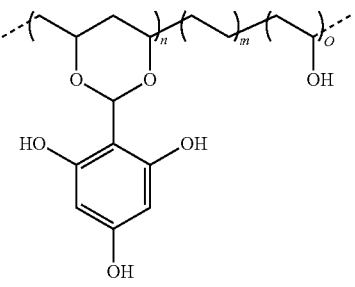
Resin 9
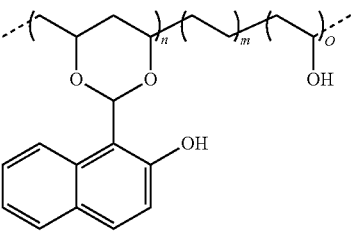
Resin 10
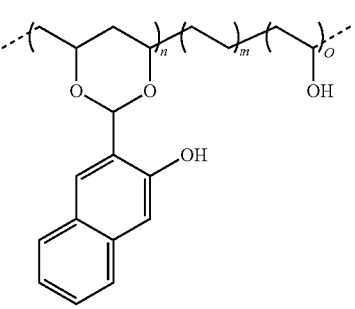
Resin 11
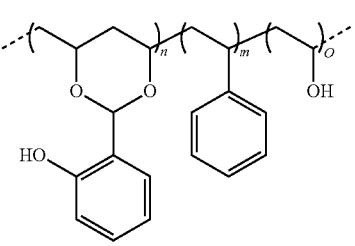
Resin 12
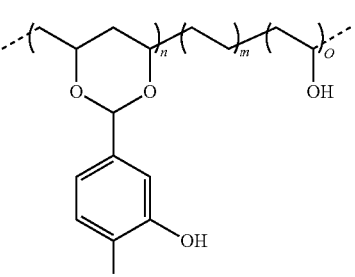
Resin 13
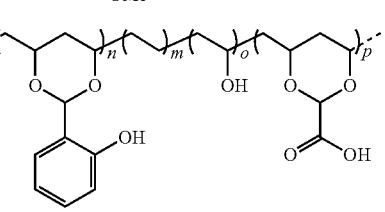
Resin 14
wherein n, m, o and p = are as defined above.
The (ethylene, vinyl acetal) copolymer can be used as a binder in the coating of an image recording material such as a lithographic printing plate precursor or a printed circuit board precursor. The lithographic printing plate precursor preferably includes a heat and/or light sensitive coating and is preferably positive-working, i.e. after exposure and development the exposed areas of the coating are removed from the support and define hydrophilic (non-printing) areas, whereas the unexposed coating is not removed from the support and defines oleophilic (printing) areas.

The light and/or heat-sensitive coating which includes the (ethylene, vinyl acetal) copolymer, may comprise one layer or more than one layer. Preferably, the coating comprises at least two layers; a first layer, and a second layer located above said first layer. First layer means that the layer is, compared to the second layer, located closer to the lithographic support. The poly(vinyl acetale) binder may be present in the first layer, in the second layer or in the first and the second layer. The poly(vinyl acetale) binder is preferably only present in the second layer.

The light and/or heat sensitive coating preferably contains, besides the (ethylene, vinyl acetal) copolymer, an alkaline soluble oleophilic resin. The oleophilic resin present in the coating is preferably a polymer that is soluble in an aqueous developer, more preferably an aqueous alkaline developing solution with a pH between 7.5 and 14. The oleophilic resin is preferably a phenolic resin selected from a novolac, a resol or a polyvinylphenolic resin. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858. One or more alkaline soluble oleophilic resins may be present in the first layer, in the second layer or in both the first and the second layer. Preferably, one or more alkaline soluble oleophilic resin(s)—preferably a resole resin—is present in the layer including the poly(vinyl acetale) binder. In the embodiment where the poly(vinyl acetale) binder is only present in the first layer, one or more alkaline soluble oleophilic resin(s)—preferably a novolac resin—is present in the second layer.

In the embodiment where the poly(vinyl acetale) binder is at least present in the second layer, the amount of phenolic resin optionally present in the coating is preferably at least 10% by weight relative to the total weight of all the components present in the coating. Preferably, the amount of phenolic resin optionally present in the coating is between 10 and 40% by weight, more preferably between 12 and 35% by weight, most preferably between 15 and 30% by weight.

In the embodiment where the poly(vinyl acetale) binder is only present in the first layer, the amount of phenolic resin present in the coating is preferably at least 20% by weight, more preferably at least 30% by weight and most preferably at least 45% by weight. Alternatively, the amount of phenolic resin in the latter embodiment is preferably between 25 and 65% by weight, more preferably between 35 and 60% wt weight and most preferably between 45 and 55% wt.

The novolac resin or resol resin may be prepared by polycondensation of aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used. The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl)propylene, 2-(m-hydroxyphenyl)propylene and 2-(p-hydroxyphenyl) propylene. Such a hydroxystyrene may have a substituent such as chloro, bromo, iodo or fluoro group or a $C_{1-4}$ alkyl group, on its aromatic ring. An example of such hydroxyphenyl (meth)acrylate is 2-hydroxy-phenyl methacrylate. The poly(vinylphenol) resin may be prepared by polymerizing one or more hydroxy-phenyl containing monomer in the presence of a radical initiator or a cationic polymerization initiator, or by copolymerizing of one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers. The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

The heat-sensitive coating may further contain one or more other binder(s) which is insoluble in water and soluble in an alkaline solution such as an organic polymer which has acidic groups with a pKa of less than 13 to ensure that the layer is soluble or at least swellable in aqueous alkaline developers. This additional binder may be present in the first layer, in the second layer or in both the first and the second layer. Preferably, the binder is present in the first layer located between the second layer including the poly(vinyl acetale) binder and the hydrophilic support. The binder may be selected from a polyester resin, a polyamide resin, an epoxy resin, an acrylic resin, a methacrylic resin, a styrene based resin, a polyurethane resin or a polyurea resin. The binder may have one or more functional groups. The functional group(s) can be selected from the list of (i) a sulfonamide group such as —NR—SO$_2$—, —SO$_2$—NR— or —SO$_2$—NR'R" wherein R and R' independently represent hydrogen or an optionally substituted hydrocarbon group such as an optionally substituted alkyl, aryl or heteroaryl group; more details concerning these polymers can be found in EP 2 159 049;

(ii) a sulfonamide group including an acid hydrogen atom such as —SO$_2$—NH—CO— or —SO$_2$—NH—SO$_2$— as for example disclosed in U.S. Pat. No. 6,573,022; suitable examples of these compounds include for example N-(p-toluenesulfonyl) methacrylamide and N-(p-toluenesulfonyl) acrylamide;

(iii) an urea group such as —NH—CO—NH—, more details concerning these polymers can be found in WO 01/96119;

(iv) a carboxylic acid group;
(v) a nitrile group;
(vi) a sulfonic acid group; and/or
(vii) a phosphoric acid group.

(Co)polymers including a sulfonamide group are preferred. Sulfonamide (co)polymers are preferably high molecular weight compounds prepared by homopolymerization of monomers containing at least one sulfonamide group or by copolymerization of such monomers and other polymerizable monomers. Preferably, in the embodiment where the poly(vinyl acetale) binder is present in the second layer, the copolymer comprising at least one sulfonamide group is present in the first layer located between the layer including the poly(vinyl acetale) binder and the hydrophilic support.

Examples of monomers copolymerized with the monomers containing at least one sulfonamide group include monomers as disclosed in EP 1 262 318, EP 1 275 498, EP 909 657, EP 1 120 246, EP 894 622, U.S. Pat. No. 5,141,838, EP 1 545 878 and EP 1 400 351. Monomers such as alkyl or aryl (meth)acrylate such as methyl (meth)acrylate, ethyl (meth)acrylate, butyl (meth)acrylate, benzyl (meth) acrylate, 2-phenylethyl (meth) acrylate, hydroxylethyl (meth) acrylate, phenyl (meth) acrylate; (meth)acrylic acid; (meth) acrylamide; a N-alkyl or N-aryl (meth)acrylamide such as N-methyl (meth)acrylamide, N-ethyl (meth)acrylamide, N-phenyl (meth)acrylamide, N-benzyl (meth)acrylamide, N-methylol (meth)acrylamide, N-(4-hydroxyphenyl)(meth) acrylamide, N-(4-methylpyridyl)(meth)acrylate; (meth) acrylonitrile; styrene; a substituted styrene such as 2-, 3- or 4-hydroxy-styrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleimide; a N-alkyl or N-aryl maleimide such as N-benzyl maleimide, are preferred.

Suitable examples of sulfonamide (co)polymers and/or their method of preparation are disclosed in EP 933 682, EP 982 123, EP 1 072 432, WO 99/63407, EP 1 400 351 and EP 2 159 049. A highly preferred example of a sulfonamide (co)polymer is described in EP 2 047 988 A in [0044] to [0046].

Specific preferred examples of sulphonamide (co)polymers are polymers comprising N-(p-aminosulfonylphenyl) (meth)acrylamide, N-(m-aminosulfonylphenyl) (meth)acrylamide N-(o-aminosulfonylphenyl) (meth)acrylamide and or m-aminosulfonylphenyl (meth) acrylate.

(Co)polymers including an imide group are also preferred as a binder in the heat-sensitive coating. Specific examples include derivatives of methyl vinyl ether/maleic anhydride copolymers and derivatives of styrene/maleic anhydride copolymers, that contain an N-substituted cyclic imide monomeric units and/or N-substituted maleimides such as a N-phenylmaleimide monomeric unit and a N-benzyl-maleimide monomeric unit. Preferably, this copolymer is present in the first layer located between the layer including the poly(vinyl acetale) binder and the hydrophilic support. This copolymer is preferably alkali soluble. Suitable examples are described in EP 933 682, EP 894 622 A [0010] to [0033], EP 901 902, EP 0 982 123 A [007] to [0114], EP 1 072 432 A [0024] to [0043] and WO 99/63407 (page 4 line 13 to page 9 line 37).

Polycondensates and polymers having free phenolic hydroxyl groups, as obtained, for example, by reacting phenol, resorcinol, a cresol, a xylenol or a trimethylphenol with aldehydes, especially formaldehyde, or ketones, may also be added to the heat-sensitive coating. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-phenylmaleimides are likewise suitable. Furthermore, polymers having units of vinylaromatics or aryl (meth)acrylates may be mentioned, it being possible for each of these units also to have one or more carboxy groups, phenolic hydroxyl groups, sulfamoyl groups or carbamoyl groups. Specific examples include polymers having units of 2-hydroxyphenyl (meth)acrylate, of 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

The dissolution behavior of the coating can be fine-tuned by optional solubility regulating components. More particularly, developability enhancing compounds, development accelerators and development inhibitors can be used. In the embodiment where the coating comprises more than one layer, these ingredients can be added to the first layer and/or to the second layer and/or to an optional other layer of the coating.

Suitable developability enhancing compounds are (i) compounds which upon heating release gas as disclosed in WO 2003/79113, (ii) the compounds as disclosed in WO 2004/81662, (iii) the compositions that comprises one or more basic nitrogen-containing organic compounds as disclosed in WO 2008/103258 and (iv) the organic compounds having at least one amino group and at least one carboxylic acid group as disclosed in WO 2009/85093.

Examples of basic nitrogen-containing organic compounds useful in the developability-enhancing compositions are N-(2-hydroxyethyl)-2-pyrrolidone, 1-(2-hydroxyethyl) piperazine, N-phenyldiethanolamine, triethanolamine, 2-[bis(2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Preferably N,N,N',N'-tetrakis(2-hydroxypropyl)-ethylenediamine is used. Mixtures of two or more of these compounds are also useful. The basic nitrogen-containing organic compounds can be obtained from a number of commercial sources including BASF (Germany) and Aldrich Chemical Company (Milwaukee, Wis.).

The basic nitrogen-containing organic compound(s) is preferably present in the coating in an amount of from 1 to 30% wt, and typically from 3 to 15% wt, based on the total solids of the coating composition.

Preferably, one or more of the basic nitrogen-containing organic compounds are used in combination with one or more acidic developability-enhancing compounds, such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides, since such a combination may permit further improved developing latitude and printing durability. Representative examples of the acidic developability-enhancing compounds are provided in [0030] to [0036] of US 2005/0214677. They may be present in an amount of from 0.1 to 30% wt based on the total dry weight of the coating composition. The molar ratio of one or more basic nitrogen-containing organic compounds to one or more acidic developability-enhancing compounds is generally from 0.1:1 to 10:1 and more typically from 0.5:1 to 2:1.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115, 128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins comprising at least 70 mol % meta-cresol as recurring monomeric units are also suitable development accelerators.

In a preferred embodiment, the coating also contains a developer resistance, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 act as dissolution inhibitors due to interaction, e.g. by hydrogen bridge formation, with the alkali-soluble resin(s) in the coating. Inhibitors of this type typically are organic compounds which include at least one aromatic group and a hydrogen bonding site such as a nitrogen atom which may be part of a heterocyclic ring or an amino substituent, an onium group, a carbonyl, sulfinyl or sulfonyl group. Suitable dissolution inhibitors of this type have been disclosed in e.g. EP 825 927 and EP 823 327. Some of the compounds mentioned below, e.g. infrared dyes, such as cyanines, and contrast dyes, such as quaternized triarylmethane dyes, can also act as a dissolution inhibitor.

Other suitable inhibitors improve the developer resistance because they delay the penetration of the aqueous alkaline developer into the coating. Such compounds can be present in the first layer and/or in the optional second layer and/or in a development barrier layer on top of said layer, as described in e.g. EP 864 420, EP 950 517, WO 99/21725 and WO 01/45958. The solubility and/or penetrability of the barrier layer in the developer can be increased by exposure to heat and/or infrared light.

Water-repellent polymers represent another type of suitable dissolution inhibitors. Such polymers seem to increase the developer resistance of the coating by repelling the aqueous developer from the coating. The water-repellent polymers can be added to the first and/or second layer of the coating and/or can be present in a separate layer provided on top of these layers. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP 864 420, EP 950 517 and WO99/21725.

Preferred examples of inhibitors which delay the penetration of the aqueous alkaline developer into the coating include water-repellent polymers including siloxane and/or perfluoroalkyl units. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer is at least 2, preferably at least 10, more preferably at least 20. It may be less than 100, preferably less than 60.

The water-repellent polymer may be a block-copolymer or a graft-copolymer including a polar block such as a poly- or oligo(alkylene oxide) and a hydrophobic block such as a long chain hydrocarbon group, a polysiloxane and/or a perfluorinated hydrocarbon group. A typical example of a perfluorinated surfactant is Megafac F-177 available from Dainippon Ink & Chemicals, Inc. Other suitable copolymers comprise about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany.

A suitable amount of such a water-repellent polymer in the coating is between 0.5 and 25 mg/m$^2$, preferably between 0.5 and 15 mg/m$^2$ and most preferably between 0.5 and 10 mg/m$^2$. When the water-repellent polymer is also ink-repelling, e.g. in the case of polysiloxanes, higher amounts than 25 mg/m$^2$ can result in poor ink-acceptance of the non-exposed areas. An amount lower than 0.5 mg/m$^2$ on the other hand may lead to an unsatisfactory development resistance.

It is believed that during coating and drying, the water-repellent polymer or copolymer acts as a surfactant and tends to position itself, due to its bifunctional structure, at the interface between the coating and air and thereby forms a separate top layer, even when applied as an ingredient of the coating solution. Simultaneously, such surfactants also act as spreading agents which improve the coating quality. Alternatively, the water-repellent polymer or copolymer can be applied in a separate solution, coated on top of the coating including one or optional more layers. In that embodiment, it may be advantageous to use a solvent in the separate solution that is not capable of dissolving the ingredients present in the other layers so that a highly concentrated water-repellent phase is obtained at the top of the coating.

The coating of the heat-sensitive printing plate precursor preferably also contains an infrared light absorbing dye or pigment which, in the embodiment where the coating comprises more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

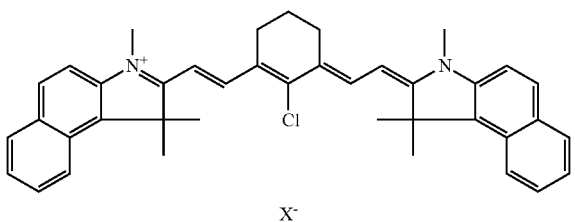

wherein $X^-$ is a suitable counter ion such as tosylate.

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not substantially removed during the processing step. As a result, a visible image is formed which enables inspection of the lithographic image on the developed printing plate. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes.

Dyes such as di- or tri-arylmethane dyes, cyanine dyes, styryl dyes and merostyryl dyes, which, combined with specific additives, only slightly color the coating but which become intensively colored after exposure, as described in for example WO2006/005688 may also be used as colorants.

To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 µm, preferably from 0.1 to 3.0 µm, particularly preferably from 0.15 to 1.0 µm.

Optionally, the coating may further contain additional ingredients such as surfactants, especially perfluoro surfactants, silicon or titanium dioxide particles or polymers particles such as matting agents and spacers.

Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The lithographic printing plate precursor comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is a grained and anodized aluminum support. The aluminum support has usually a thickness of about 0.1-0.6 mm. However, this thickness can be changed appropriately depending on the size of the printing plate used and/or the size of the platesetters on which the printing plate precursors are exposed. The aluminium is preferably grained by electrochemical graining, and anodized by means of anodizing techniques employing phosphoric acid or a sulphuric acid/phosphoric acid mixture. Methods of both graining and anodization of aluminum are well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate has preferably an Ra value between 0.30 µm and 0.60 µm, more preferably between 0.35 µm and 0.55 µm and most preferably between 0.40 µm and 0.50 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminium surface) varies between 1 and 8 $g/m^2$. The anodic weight is preferably between 1.5 $g/m^2$ and 5.0 $g/m^2$, more preferably 2.5 $g/m^2$ and 4.0 $g/m^2$ and most preferably 2.5 $g/m^2$ and 3.5 $g/m^2$.

The grained and anodized aluminum support may be subject to a so-called post-anodic treatment to improve the hydrophilic character of its surface. For example, the aluminum support may be silicated by treating its surface with a solution including one or more alkali metal silicate compound(s)—such as for example a solution including an alkali metal phosphosilicate, orthosilicate, metasilicate, hydrosilicate, polysilicate or pyrosilicate—at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution, gluconic acid, or tartaric acid. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, acetals of polyvinyl alcohols formed by reaction with a sulphonated aliphatic aldehyde, polyacrylic acid or derivates such as GLASCOL E15™ commercially available from Ciba Speciality Chemicals. One or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

In a preferred embodiment, the support is first treated with an aqueous solution including one or more silicate compound(s) as described above followed by the treatment of the support with an aqueous solution including a compound having a carboxylic acid group and/or a phosphonic acid group, or their salts. Particularly preferred silicate compounds are sodium or potassium orthosilicate and sodium or potassium metasilicate. Suitable examples of a compound with a carboxylic acid group and/or a phosphonic acid group and/or an ester or a salt thereof are polymers such as polyvinylphosphonic acid, polyvinylmethylphosphonic acid, phosphoric acid esters of polyvinyl alcohol, polyacrylic acid, polymethacrylic acid and a copolymer of acrylic acid and vinylphosphonic acid. A solution comprising polyvinylphosphonic acid or poly(meth)acrylic acid is highly preferred.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP 1 025 992.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e. no substantial effect on the dissolution rate of the coating in the developer is induced by exposure to visible light. Most preferably, the coating is not sensitive to ambient daylight, i.e. the wavelength range including near UV light (300-400 nm) and visible light (400-750 nm).

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 µm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

After exposure, the precursor is developed whereby the non-image areas of the coating are removed by immersion in a developer, preferably an aqueous alkaline developer, which may be combined with mechanical rubbing, e.g. by a rotating brush. The developer preferably comprises an alkaline agent which may be an inorganic alkaline agent such as an alkali metal hydroxide, an organic alkaline agent such as an amine, and/or an alkaline silicate such as an alkali metal silicate or an alkali metal metasilicate. The developer preferably has a pH above 8, more preferably above 10 and most preferably above 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a polyhydroxyl compound such as e.g. sorbitol, preferably in a concentration of at least 40 g/l, and also a polyethylene oxide containing compound such as e.g. Supronic B25, commercially available from RHODIA, preferably in a concentration of at most 0.15 g/l.; this may be combined with mechanical rubbing, e.g. by using a rotating brush. During development, any water-soluble protective layer present is also removed.

More details concerning the development step can be found in for example EP 1 614 538, EP 1 614 539, EP 1 614 540 and WO/2004071767.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants. A suitable gum solution which can be used after the development step is described in for example EP 1 342 568 and WO 2005/111727. The plate precursor can, if required, be further post-treated with a suitable correcting agent or preservative as known in the art.

To increase the resistance of the finished printing plate and hence to extend its press life capability (run length) the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447, 963 and GB 1,154,749.

The heat and/or light sensitive printing plates can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

Synthesis of Inventive Resins 1 to 5 and Comparative Resin 1

The structural formulae shown below indicate the monomer composition of the prepared resins but the sequence of the moieties is for illustration only and does not necessarily reflect reality since the resins are typically random copolymers as indicated by the brackets in the structural formulae.

Synthesis of Inventive Resin 1

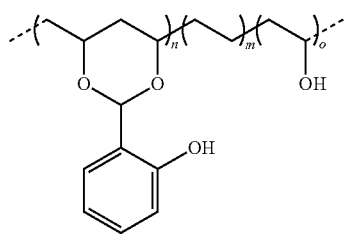

Reaction scheme:

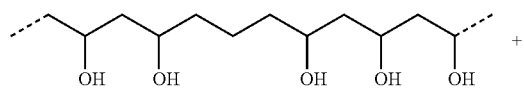

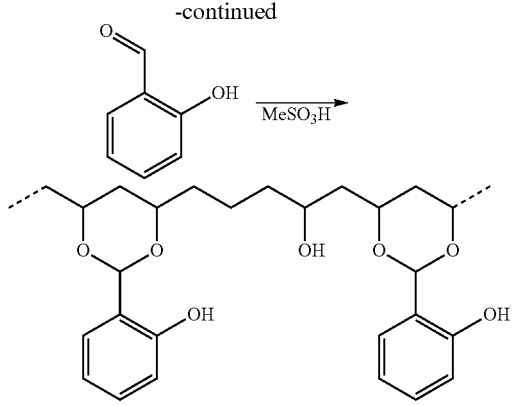

Experimental Procedure:

114.3 g of poly(ethylene, vinyl alcohol) (32 mol % ethylene, supplied by Aldrich) was added to 260 gram of dimethylsulfoxide. The reaction mixture was heated to 45° C. and the polymer was allowed to swell for 48 hours at room temperature. The reaction mixture was then heated to 80° C. to dissolve the polymer completely. Upon complete dissolution, the reaction mixture was cooled to 70° C., 4.8 g (0.05 mol) of methane sulfonic acid in 45 g of dimethyl sulfoxide was added and the reaction mixture was stirred for 10 minutes at 70° C. 122.1 g (1 mol) of salicylic aldehyde in 90 g of dimethylsulfoxide was added over 20 minutes and the reaction was allowed to continue for 90 minutes at 70° C. The reaction mixture was heated to 80° C. and 200 g of anisole was added. The reaction temperature was increased to 104° C. and the azeotropic mixture of anisole and water was distilled under reduced pressure, by gradually reducing the pressure from 230 mbar to 45 mbar. Upon complete removal of the anisole, 10.1 g of triethyl amine, 200 g of dimethyl acetamide and 200 g of 2-methoxy-1-propanol were added. The reaction mixture was then cooled to room temperature. 1.2 times the total weight of the reaction mixture of dimethyl acetamide and 1.5 times the total weight of the reaction mixture of 2-methoxy-1-propanol were added to the reaction mixture which was then gradually added to 6 kg of an ice/water mixture. Then, 500 g of 2-methoxy-1-propanol was added and the precipitated polymer was isolated by filtration. The polymer was redissolved in 2 liter of dimethyl acetamide at 35° C. 1 liter of 2-methoxy-1-propanol was added and the solution was gradually added to 8 kg of an ice water mixture. The polymer was isolated by filtration, treated with a mixture of 5 liter of water and 1 liter of 2-methoxy-1-propanol and dried. 135 g of Inventive Resin 1 was isolated.

Analytical Characterization:

Resin 1 was analyzed with gel permeation chromatography using dimethyl acetamide/LiCl/acetic acid as eluent (2.1 g of LiCl and 6 ml of acetic acid per liter eluent) on a PL-gel 5 μm Mixed-D (300×7.5 mm) column, supplied by Polymer Laboratories (Varian) (exclusion limit: 200-400 000 Da), relative to polystyrene standards. The results obtained were as follows:

Mn: 99600
Mw: 197000
PD (Mw/Mn): 1.98

The molar ratio of the moieties of Resin 1 were determined by 1H-NMR spectroscopy. 10 mg of Resin 1 was dissolved in 0.8 ml of DMSO-d6 at 25° C., using a Varian Unity Inova at a spectrometer frequency of 400 MHz. The results obtained were as follows:

m (ethylene moieties A): 40 mol %
n (acetal moieties B): 30 mol %
o (vinyl alcohol moieties C): 30 mol %

Synthesis of Inventive Resin 2

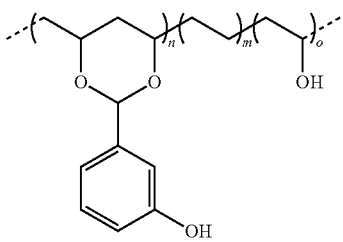

Reaction scheme:

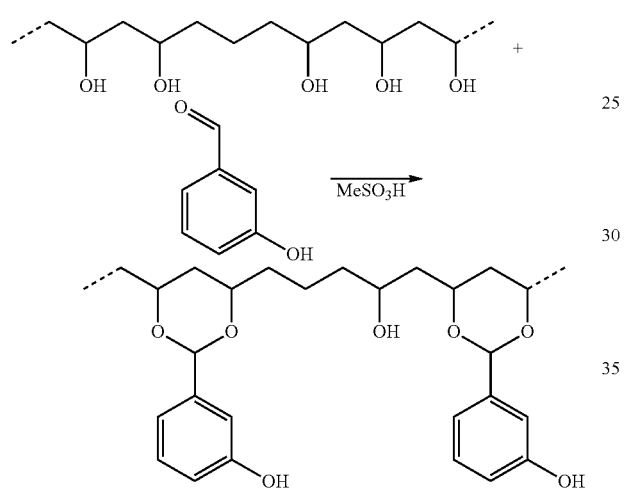

Experimental Procedure:

5.7 g of poly(ethylene, vinyl alcohol) (32 mol % ethylene, supplied by Aldrich) was added to 40 g of dimethyl acetamide and the reaction mixture was heated to 80° C. The mixture was stirred for 2 hours at 80° C. Upon complete dissolution of the polymer, 0.24 g (2.5 mmol) of methane sulfonic acid in 2.25 g of dimethyl acetamide was added. The mixture was stirred for an additional 30 minutes at 80° C. 6.1 g (0.05 mol) of 3-hydroxy-benzaldehyde in 4.5 g of dimethyl acetamide was added over 10 minutes and the reaction was allowed to continue at 80° C. for 16 hours. 50 g of ethyl acetate was added and the ethyl acetate was distilled under reduced pressure, gradually reducing the pressure from 800 mbar to 40 mbar, while maintaining the reactor jacket temperature at 105° C. Upon complete distillation, the reaction mixture was cooled to room temperature and 0.51 g (5 mmol) of triethyl amine in 10 g of dimethyl acetamide was added. The reaction mixture was slowly added to 200 ml of water. The precipitated polymer was isolated by filtration and redissolved in 100 ml of acetone. The polymer solution was added to 750 ml of water/ice, the polymer was isolated by filtration and dried. 8.2 g of Inventive Resin 2 was isolated.

Analytical Characterization:

Resin 2 was analyzed with GPC and $^1$H-NMR spectroscopy as described above for Resin 1. The results obtained were as follows:

$M_n$: 109000
$M_w$: 186000
PD ($M_w/M_n$): 1.7
m (ethylene moieties A): 38 mol %
n (acetal moieties B): 33 mol %
o (vinyl alcohol moieties C): 29 mol %

Synthesis of Inventive Resin 3

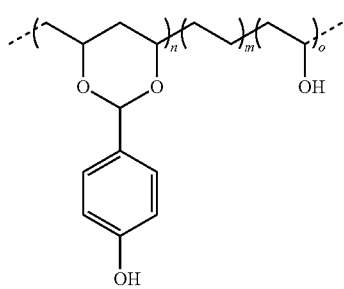

Reaction scheme:

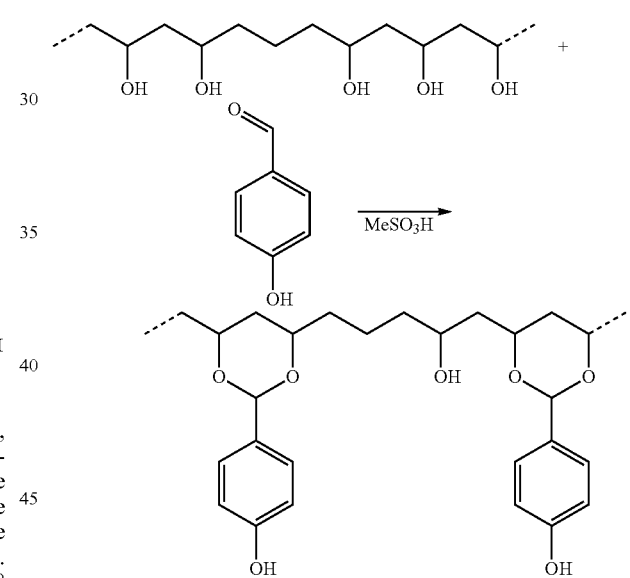

Experimental Procedure:

5.7 g of poly(ethylene, vinyl alcohol) (32 mol % ethylene, supplied by Aldrich) was added to 40 g of dimethyl acetamide and the reaction mixture was heated to 80° C. The mixture was stirred for 2 hours at 80° C. Upon complete dissolution of the polymer, 0.24 g (2.5 mmol) of methane sulfonic acid in 2.25 g of dimethyl acetamide was added. The mixture was stirred for an additional 30 minutes at 80° C. 6.1 g (0.05 mol) of 4-hydroxy-benzaldehyde in 4.5 g of dimethyl acetamide was added over 10 minutes and the reaction was allowed to continue at 80° C. for 16 hours. 50 g of ethyl acetate was added and the ethyl acetate was distilled under reduced pressure, gradually reducing the pressure from 750 mbar to 40 mbar, while maintaining the reactor jacket temperature at 105° C. Upon complete distillation, the reaction mixture was cooled to room temperature and 0.51 g (5 mmol) of triethyl amine in 10 g of dimethyl acetamide was added. The reaction mixture was slowly added to 250 ml water. The precipitated polymer was isolated by filtration, redispersed in 600 ml of water and 200 ml of 2-methoxy-1-propanol, isolated by filtration and dried. 9.9 g of Inventive Resin 3 was isolated.

Analytical Characterization:

Resin 3 was analyzed with GPC and $^1$H-NMR spectroscopy as described above for Resin 1. The results obtained were as follows:

$M_n$: 115000
$M_w$: 228000
PD ($M_w/M_n$): 2.0
m (ethylene moieties A): 38 mol %
n (acetal moieties B): 29 mol %
o (vinyl alcohol moieties C): 33 mol %

Synthesis of Inventive Resin 4

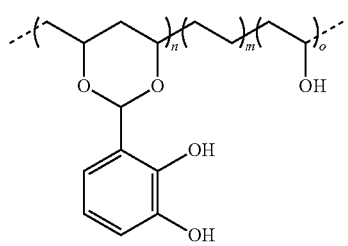

Reaction scheme:

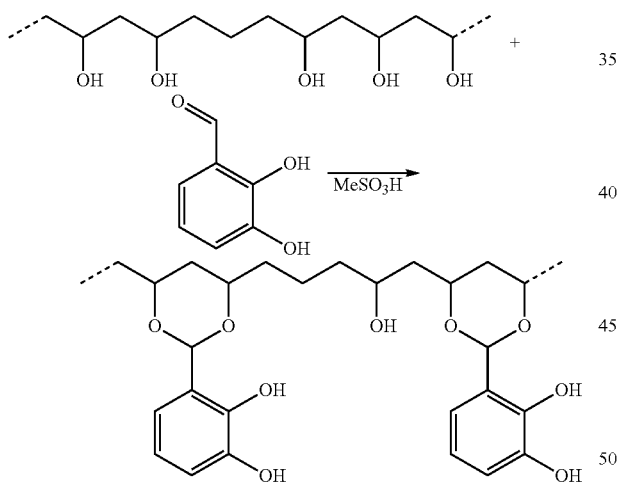

Experimental Procedure:

4 g of poly(ethylene, vinyl alcohol) (32 mol % ethylene, supplied by Aldrich) was added to 28 g of dimethyl acetamide and the reaction mixture was heated to 80° C. The mixture was stirred for one and a half hour at 80° C. Upon complete dissolution of the polymer, 0.16 g (1.7 mmol) of methane sulfonic acid in 1.6 g of dimethyl acetamide was added. The mixture was stirred for an additional 30 minutes at 80° C. 4.8 g (0.035 mol) of 2,3-dihydroxy-benzaldehyde in 10.5 g of dimethyl acetamide was added over 30 minutes and the reaction was allowed to continue at 80° C. for 20 hours. 17.5 g of ethyl acetate was added and the ethyl acetate was distilled under reduced pressure, gradually reducing the pressure from 500 mbar to 50 mbar, while maintaining the reactor jacket temperature at 105° C. Upon complete distillation, the reaction mixture was cooled to room temperature and 0.35 g (3.5 mmol) of triethyl amine in 10 g of dimethyl acetamide was added. 30 g of 1-methoxy-2-propanol was added and the reaction mixture was slowly added to 280 ml of water/ice. The mixture was stirred for one hour and the precipitated polymer was isolated by filtration. The polymer was redispersed in 200 ml water and 50 ml of 2-methoxy-1-propanol, stirred for one and a half hour, isolated by filtration and dried. 6.7 g of Inventive Resin 5 was isolated.

Analytical Characterization:

Resin 5 was analyzed with GPC and $^1$H-NMR spectroscopy as described above for Resin 1. The results obtained were as follows:

$M_n$: 138000
$M_w$: 268000
PD ($M_w/M_n$): 1.9
m (ethylene moieties A): 38 mol %
n (acetal moieties B): 28 mol %
o (vinyl alcohol moieties C): 34 mol %

Synthesis of Inventive Resin 5

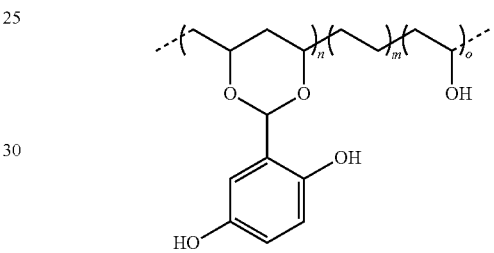

Reaction scheme:

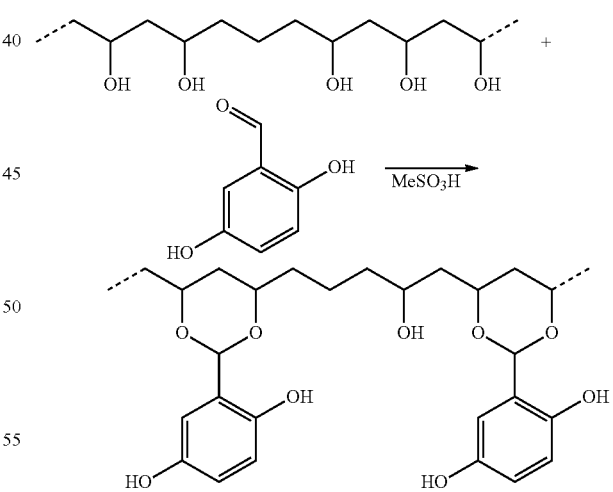

Experimental Procedure:

11.4 (0.1 mol) of poly(ethylene, vinyl alcohol) (32 mol % ethylene, supplied by Aldrich) was added to 80 g of dimethyl acetamide and the reaction mixture was heated to 80° C. The mixture was stirred for 2 hours at 80° C. Upon complete dissolution of the polymer, 0.48 g (5 mmol) of methane sulfonic acid in 4.5 g of dimethyl acetamide was added. The mixture was stirred for an additional 30 minutes at 80° C. 13.8 g (0.1 mol) of 2,5-dihydroxy-benzaldehyde in 30 g of dimethyl-acetamide was added over 10 minutes and the reaction was allowed to continue at 80° C. for 16 hours. 50 g of ethyl acetate was added and the ethyl acetate was distilled under reduced pressure, gradually reducing the pressure from 850 mbar to 50 mbar, while maintaining the reactor jacket temperature at 105° C. Upon complete distillation, the reaction mixture was cooled to room temperature and 1 g (5 mmol) of triethyl amine in 20 g of dimethyl acetamide was added. The reaction mixture was diluted with 50 g of 1-methoxy-2-propanol and slowly added to 750 ml of ice/water. The polymer was isolated and redissolved in 350 ml of acetone and 100 ml of 1-methoxy-2-propanol. The polymer solution was slowly added to 0.5 liter of ice/water. The polymer was isolated by filtration and dried. 18.3 g of Inventive Resin 6 was isolated.

Analytical Characterization:

Resin 6 was analyzed with GPC and $^1$H-NMR spectroscopy as described above for Resin 1. The results obtained were as follows:

$M_n$: 104000
$M_w$: 249000
PD ($M_w/M_n$): 2.4
m (ethylene moieties A): 38 mol %
n (acetal moieties B): 30 mol %
o (vinyl alcohol moieties C): 32 mol %

Synthesis of Comparative Resin 1

539 g of Poval 103, a polyvinyl alcohol with a hydrolysis degree of 98.5% supplied by Kuraray, was dissolved in 1560 g of dimethyl sulfoxide at 80° C. The reaction mixture was cooled to 65° C. 28.8 g (0.3 mol) of methane sulfonic acid dissolved in 270 g of dimethyl sulfoxide was added followed by the addition of 43.3 g (0.6 mol) of butyraldehyde. The reaction was allowed to continue for 30 minutes at 65° C. 403 g (3.3 mol) of salicylic aldehyde, dissolved in 540 g of dimethyl sulfoxide, was added to the mixture over one hour. The reaction was allowed to continue at 55° C. for 16 hours. The reaction mixture was then heated to 80° C., 1200 g of anisole was added over one hour and water was removed azeotropically under reduced pressure, gradually reducing the pressure from 210 mbar to 85 mbar at a reaction temperature of 110° C. 175.4 g (1.2 mol) of butyraldehyde diethyl acetal dissolved in 210 g of dimethyl acetamide was added over one hour at 80° C. The reaction was allowed to continue for an extra hour at 80° C. 60.7 g (0.6 mol) of triethylamine, dissolved in 210 g of dimethyl acetamide was added and the reaction mixture was allowed to cool down to room temperature. 3333 g of dimethyl acetamide and 3754 g of 2-methoxy-propanol were added to the reaction mixture and the binder was precipitated in 27 l water. The binder was isolated by filtration and dried. 860 g of Comparative Resin 1 was isolated. The molecular weight $M_w$ of Comparative Resin CR-01 was 170000.

Preparation of the Lithographic Supports

Preparation of the Lithographic Support S-00

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/$dm^2$ (charge density of about 800 C/$dm^2$). Afterwards, the aluminium foil was desmutted by etching with an aqueous solution containing 6.5 g/l of sodium hydroxide at 35° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and an anodic charge of 250 C/$dm^2$, then washed with demineralised water for 7 seconds and dried at 120° C. for 7 seconds.

The support thus obtained (support S-00) was characterised by a surface roughness $R_a$ of 0.45-0.50 μm (measured with interferometer WYKO NT1100™ Optical profiling system) and had an anodic weight of about 3.0 g/$m^2$ (gravimetric analysis).

Preparation of the Lithographic Support S-01

The lithographic support S-01 was produced by spraying, onto the above described support S-00, a post treatment solution containing 2.2 g/l polyvinylphosphonic acid (PVPA) for 4 seconds at 70° C., rinsed with demineralised water for 3.5 seconds and dried at 120° C. for 7 seconds.

Example 1

Printing Plate PP-01

Preparation of Printing Plate Precursor PPP-01

Coating solution CS-01, defined in Table 1, was coated at a wet coating thickness of 25 μm (40 $m^2$/liter) on the grained and anodized aluminium support S-01 and then dried at 100° C. during 1 minute. The printing plate precursor PPP-01 thus obtained was then aged at 55° C. during 48 hours.

TABLE 1

| Composition of the coating solution CS-01 | |
|---|---|
| INGREDIENTS | g |
| 1-methoxy-2-propanol | 349.80 |
| 2-butanone | 473.55 |
| Tegoglide 410 (1) | 8.64 |
| Polyfox PF652NF (2) | 0.44 |
| Inventive Resin 1 (as described above) | 44.82 |
| Contrast dye (3) | 117.16 |
| IR dye (4) | 1.30 |
| Compound (5) | 4.29 |
| Total | 1000.00 |

(1) Solution in 1-methoxy-2-propanol of 1% by weight of a copolymer of polysiloxane and poly(alkylene oxide), which is commercially available from Tego Chemie Service GmbH, Germany.
(2) Solution in 1-methoxy-2-propanol of 50% by weight of a perfluorosurfactant, having a chemical structure as defined below, which is commercially available from Omnova Solutions Inc.

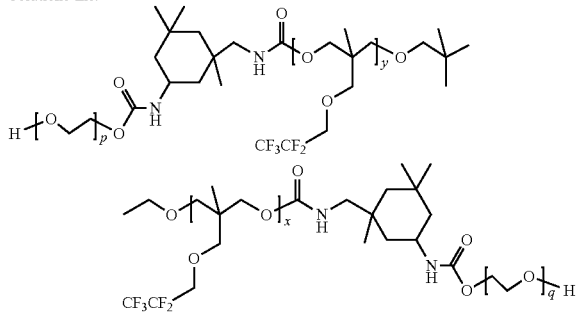

wherein the number average degree of polymerization x + y is about 10 and the number average degree of polymerization p + q is about 17.8.
(3) Solution in 1-methoxy-2-propanol of 1% by weight of Crystal Violet, commercially available from Ciba-Geigy GmbH.

TABLE 1-continued

Composition of the coating solution CS-01

| INGREDIENTS | g |
|---|---|

(4) Infrared cyanine dye, commercially available from FEW CHEMICALS having the following chemical structure:

[Structure of infrared cyanine dye with Cl substituent and tosylate counterion]

(5) Compound synthesized as described in Example 11 of EP 1 985 445, and having the following structure:

[Structure of imidazopyrimidinone compound with methyl group]

Exposure

The printing plate precursor PPP-01 was image-wise exposed at a range of energy densities with a Creo Trendsetter, a platesetter having a 20 W infrared laser head (830 nm), operating at 140 rpm and 2400 dpi, commercially available from Eastman Kodak Corp. The image had a 50% dot coverage and consisted of a 10 μm×10 μm checkerboard pattern.

Development

The exposed precursor was then developed in an Agfa Autolith TP105 processor, commercially available from Agfa Graphics, with developer DEV-01 defined below in the developer section and tap water at room temperature in the finisher section. The developer dwell time was 25 seconds and the developer temperature was 25° C.

Preparation of Developer DEV-01:

To 600 ml. of demineralised water was added:

1 ml of a 50 wt. % solution of NaOH;

0.1 g of SAG220 Anti-Foam Emulsion, which is a polydimethylsiloxane emulsion in water (20 wt % active material), commercially available from Momentive Performance Materials Inc.;

115 g of sodium metasilicate pentahydrate, commercially available from SILMACO N.V.;

4 g of LiCl, commercially available from Aako BV;

4 g of Akypo RLM-45CA, a 90 wt. % alcohol ether carboxylate surfactant solution in water, commercially available from Kao Chemicals GmbH;

2 g of a 50 wt. % solution in water of Preventol R50, commercially available from Bayer AG;

7 g of a 25 wt. % solution of the following compound, commercially available from Rhodia Ltd. (Briquest 543-25S):

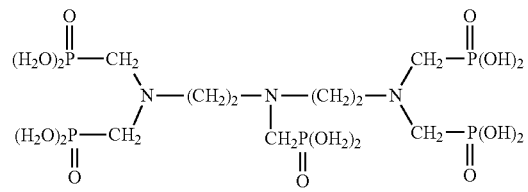

7 g of Ralufon DCH, a 50 wt. % of N,N-dimethyl-N-coco-N-(3-sulfopropyl) ammonium betaine in water, from Raschig GmbH.;

10 g of sodium caprylamphopropionate (Crodateric CYAP, available from Croda Chemicals Europe Ldt.);

28 g of a 35.5 wt. % solution in water of sodium silicate, commercially available from Silmaco NV, Belgium.

demineralized water until 1000 ml; and, a 50 wt. % solution of NaOH in water in an amount necessary to set the conductivity at 76.0+/−0.1 mS/cm (measured at 25° C.)

Plate Sensitivity Test

The printing plate sensitivity was determined on the processed plates PP-01 as the energy density at which the 10 μm×10 μm checkerboard has a 52% dot area coverage (as measured with a GretagMacbeth D19C densitometer, commercially available from GretagMacbeth AG). The result was 202 mJ/cm².

Example 2

Printing Plate Precursors PPP-02 and PPP-03

Preparation

Coating solutions CS-02 and CS-03, as defined in Table 2, were each coated at a wet coating thickness of 25 μm (40 m²/liter) on the grained and anodized aluminium support S-01 and then dried at 100° C. during 1 minute. The obtained printing plate precursor PPP-02 and PPP-03 were aged at 55° C. during 48 hours.

TABLE 2

Composition of the coating solutions CS-02 and CS-03

| INGREDIENTS (g) | CS-02 (Comp.) | CS-03 (Inv.) |
|---|---|---|
| 1-methoxy-2-propanol | 301.52 | = |
| 2-butanone | 317.37 | = |
| ˜Y-butyrolactone | 172.00 | = |
| Tegoglide 410 (*) | 8.56 | = |
| Polyfox PF652NF (*) | 0.43 | = |
| Comparative Resin 1 (described above) | 30.37 | — |
| Inventive Resin 1 (described above) | — | 30.37 |
| Contrast dye (*) | 117.50 | = |
| IR dye (*) | 1.30 | = |
| 10 wt. % solution of N,N,N',N'-tetrakis(2-hydroxy-propyl) ethylene-diamine in 1-methoxy-2-propanol. | 23.56 | = |
| 50 wt. % solution in 1-methoxy-2-propanol of Bakelite PF9900LB, a resole commercially available from Hexion Specialty Chemicals AG. | 27.29 | = |

(*) as defined in Table 1.

Abrasion Resistance Test

The abrasion resistance of the printing plates precursors PPP-02 (Comparative Example) and PPP-03 (Inventive Example) was tested as follows. The coating of each plate precursor was wetted at six areas, by applying 4 ml of demineralised water at each area, so as to obtain six distinct wetted areas having a diameter of about 40 mm each. A round rubber (hardness 65 Shore A) stamp with a diameter of 15 mm was placed on each wet area. The rubber stamps were then rotated at a speed of 100 rpm, while maintaining contact between the stamp and the coating at a load of 9.5 N per stamp, during a number of test cycles (see Table 3), each consisting of 25 seconds of contact between the rotating stamps and the coating, followed by 1 second of non-contact in order to allow the water to spread again on the contact area. After conclusion of the test cycles, the wear of the coating was evaluated by visual inspection:

- a score of 0 was given to a contact area without any visible damage of the coating.
- a score of 1 was given to a contact area where a slight colour change was visible.
- a score of 2 was given to a contact area where a strong colour change was visible.
- a score of 3 was given to a contact area where aluminium oxide was visible.
- a score of 4 was given to a contact area where bare aluminium was visible.

The sum of the scores obtained from the 6 contact areas of each printing plate precursor is given in Table 3.

TABLE 3 results of the abrasion resistance

| Example | Precursor | Abrasion resistance 300 cycles | Abrasion resistance 500 cycles |
|---|---|---|---|
| Comparative Example | PPP-02 | 12 | 18 |
| Invention Example | PPP-03 | 0 | 10 |

The above results show that the binder according to preferred embodiments of the invention (Inventive Resin 1, PPP-03) compared to the comparative binder (Comparative Resin 1, PPP-02), significantly improves the abrasion resistance of the printing plate precursor.

Example 3

Printing Plates PP-04 to PP-09

Preparation of the Printing Plate Precursors PPP-04 to PPP-09

The printing plate precursors PPP-04 to PPP-09 were produced by first applying on the grained and anodized aluminium support S-01 the coating solution containing the ingredients as defined in Table 4 dissolved in a mixture of solvents. The coating solution was applied at a wet coating thickness of 26 μm and then dried at 115° C. for 3 minutes.

TABLE 4 composition of the first coating solutions CS-04, CS-05 and CS-06.

| Coating solutions | Resin (1) g/m² | Solvent mixture (2) % by volume | Contrast dye (3) g/m² | Tegoglide 410 (4) g/m² |
|---|---|---|---|---|
| CS-04 | Resin A 0.789 | 57/33/10/0 | 0.010 | 0.001 |
| CS-05 | Resin B 0.789 | 0/25/50/25 | 0.010 | 0.001 |
| CS-06 | Resin C 0.789 | 0/25/50/25 | 0.010 | 0.001 |

(1) See Table 5 below;
(2) Solvent mixture in the order given: tetrahydrofuran, Dowanol PM (1-methoxy-2-propanol, commercially available from DOW CHEMICAL Company), gamma-butyrolactone and butanone;
(3) and (4) as defined in Table 1.

TABLE 5

Resins A, B and C

| Resin (1) | Structure |
|---|---|
| Resin A | 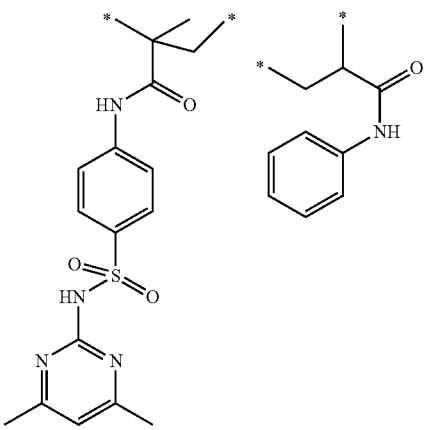 65/35 |
| Resin B | 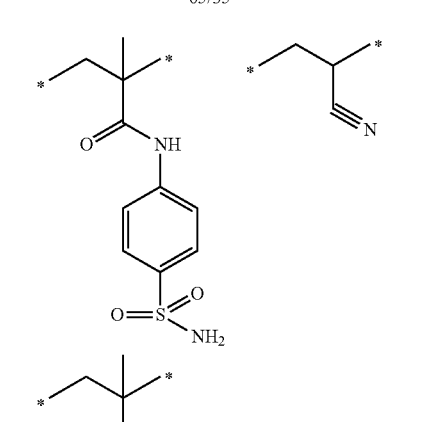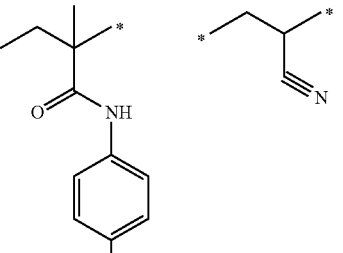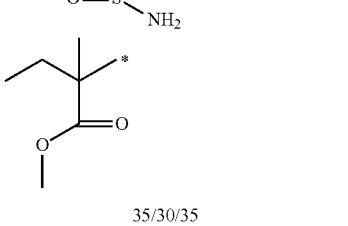 35/30/35 |

TABLE 5-continued

Resins A, B and C

| Resin (1) | Structure |
|---|---|
| Resin C | 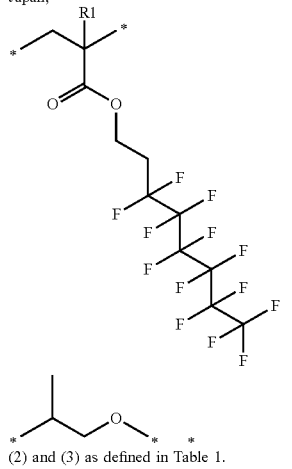 45/35/20 |

(1) resin A was synthesized as described in EP 2 159 049; Resin B was synthesized as described in EP 909 657; and Resin C was synthesized as described WO 99/63407.
* denotes the binding sites of the monomeric unit in the polymer backbone.

Subsequently, a second coating solution containing the ingredients as defined in Table 6, was applied onto the coated support. The second coating solution was applied at a wet coating thickness of 26 μm and then dried at 115° C. for 3 minutes. The printing plate precursors PPP-04 to PPP-09 were obtained (see Table 7).

TABLE 6

Composition of the second coating solutions

| INGREDIENTS (g) | CS-07 (Comp.) | CS-08 (Inv.) |
|---|---|---|
| 1-methoxy-2-propanol | 350.70 | = |
| 2-butanone | 571.83 | = |
| Megaface EXP TF1534 (1) | 0.43 | = |
| 15 wt. % solution in 2-butanone of 1,2,3,6-tetrahydrophtalic anhydride | 8.57 | = |
| Comparative Resin 1 (described above) | 22.99 | — |
| Inventive Resin 1 (described above) | — | 22.99 |
| Contrast dye (2) | 32.00 | = |
| IR dye (3) | 1.41 | = |
| 50 wt. % solution in 1-methoxy-2-propanol of Bakelite PF9900LB, a resole commercially available from Hexion Specialty Chemicals AG. | 12.07 | = |

(1) Solution in 4-methylpentan-2-one of 30% by weight of a copolymer of fluorinated acrylic copolymer, which is commercially available from Dainippon Ink and Chemicals, Japan;

(2) and (3) as defined in Table 1.

TABLE 7

Printing plate precursors PPP-04 to PPP-09.

| Printing plate precursors | First coating solution | Second coating solution |
|---|---|---|
| PPP-04, comparative | CS-04 | CS-07 |
| PPP-05, comparative | CS-05 | CS-07 |
| PPP-06, comparative | CS-06 | CS-07 |
| PPP-07, inventive | CS-04 | CS-08 |
| PPP-08, inventive | CS-05 | CS-08 |
| PPP-09, inventive | CS-06 | CS-08 |

Abrasion Resistance Test

The abrasion resistance of the printing plates precursors PPP-04, PPP-05, PPP-07 and PPP-08 was tested as described in Example 2.

The results obtained are given in Table 8.

TABLE 8

Abrasion resistance results

| Example | Precursor | Abrasion resistance 300 cycles |
|---|---|---|
| Comparative Example | PPP-04 | 15 |
| Comparative Example | PPP-05 | 15 |
| Invention Example | PPP-07 | 3 |
| Invention Example | PPP-08 | 2 |

The above results show that the binder according to preferred embodiments of the invention (Inventive Resin 1, PPP-07 and PPP-08) compared to the comparative binder (Comparative Resin 1, PPP-04 and PPP-05), significantly improves the abrasion resistance of the printing plate precursor.

Exposure

The printing plate precursors PPP-04 to PPP-09 were image-wise exposed at a range of energy densities with a Creo Trendsetter, as defined in Example 1. The image had a 50% dot coverage and consisted of a 10 μm×10 μm checkerboard pattern.

Developing

The image-wise exposed precursors were then developed by dipping the precursors in the developer DEV-02, as defined below, at a temperature of 25° C. during a dwell time of 20 s. Printing plates PP-04 to PP-09 were obtained.

Preparation of Developer DEV-02:

To 600 ml. of demineralised water was added:
    6 ml of a 50 wt. % solution of NaOH;
    15 g of Caprylic acid, commercially available from Acros Chimica NV;
    100 g of sodium metasilicate pentahydrate, commercially available from SILMACO N.V.;
    4 g of LiCl, commercially available from Aako BV;
    4 g of Akypo RLM-45CA, a 90 wt. % alcohol ether carboxylate surfactant solution in water, commercially available from Kao Chemicals GmbH;
    3 g of a 50 wt. % solution in water of Preventol R50, commercially available from Bayer AG;
    0.05 g of SAG220 Anti-Foam Emulsion, which is a polydimethylsiloxane emulsion in water (20 wt % active material), commercially available from Momentive Performance Materials Inc.;

7 g of a 25 wt. % solution of the following compound, commercially available from Rhodia Ltd. (Briquest 543-25S):

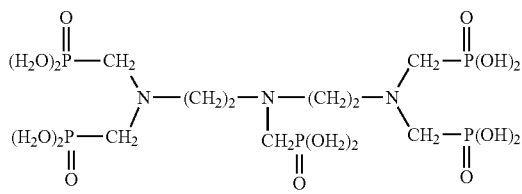

demineralized water until 1000 ml; and, a 50 wt. % solution of NaOH in water in an amount necessary to set the conductivity at 85.8+/−0.1 mS/cm (measured at 20° C.)

Plate Sensitivity Test

The printing plate sensitivity was determined on the processed plates PP-04 to PP-09 as the energy density at which the 10 μm×10 μm checkerboard has a 52% dot area coverage (as measured with a GretagMacbeth D19C densitometer, commercially available from GretagMacbeth AG). The results for the sensitivity are given in Table 9.

TABLE 9

Sensitivity results

| Printing plate | Resin | Sensitivity mJ/cm$^2$ |
|---|---|---|
| PP-04, comp. | Resin A | 153 |
| PP-07, inv. | Resin A | 131 |
| PP-05, comp. | Resin B | 160 |
| PP-08, inv. | Resin B | 94 |
| PP-06, comp. | Resin C | 233 |
| PP-09, inv. | Resin C | 160 |

The results in Table 9 demonstrate that the printing plates including the resin according to preferred embodiments of the present invention exhibit an improved sensitivity in comparison with the comparative examples which do not contain a resin of the present invention.

Example 4

Printing Plates PP-10 and PP-11

Preparation of the Printing Plate Precursors PPP-10 and PPP-11

The printing plate precursors PPP-10 and PPP-11 were produced by first applying on the grained and anodized aluminium support S-01 the coating solution containing the ingredients as defined in Table 10. The coating solution was applied at a wet coating thickness of 26 μm and then dried at 115° C. for 3 minutes.

TABLE 10

Composition of the first coating solutions CS-10 and CS-11

| INGREDIENTS (g) | CS-10 | CS-11 |
|---|---|---|
| Tetrahydrofuran | 587.03 | — |
| 1-methoxy-2-propanol | 320.80 | — |
| Tegoglide 410 (1) | 6.31 | — |
| Comparative Resin 1 (described above) | 22.74 | — |
| Inventive Resin 1 (described above) | — | 22.74 |
| Contrast dye (2) | 42.00 | — |
| IR dye (3) | 0.70 | — |
| 50 wt. % solution in 1-methoxy-2-propanol of Bakelite PF9900LB, a resole commercially available from Hexion Specialty Chemicals AG. | 20.43 | — |

(1), (2) and (3) as defined in Table 1.

Subsequently, a second coating solution CS-12 containing the ingredients as defined in Table 11, was applied onto the coated support. The second coating solution was applied at a wet coating thickness of 26 μm and then dried at 115° C. for 3 minutes.

TABLE 11

Composition of the second coating solution

| INGREDIENTS (g) | CS-12 |
|---|---|
| 1-methoxy-2-propanol | 708.89 |
| 2-butanone | 186.20 |
| Megaface EXP TF1534 (1) | 0.43 |
| 15 wt. % solution in 2-butanone of 1,2,3,6-tetrahydrophtalic anhydride | 10.28 |
| Alnovol SPN402 (2) | 48.35 |
| Contrast dye (3) | 43.00 |
| IR dye (4) | 0.71 |
| TMCA (5) | 2.14 |

(1) as defined in Table 6;
(2) Solution in 1-methoxy-2-propanol of 40% by weight of phenolic resin commercially available from Clariant;
(3) and (4) as defined in Table 1;
(4) Solution in 1-methoxy-2-propanol of 10% by weight of 3,4,5-trimethoxycinnamic acid.

Exposure and Development

The obtained printing plate precursors PPP-10 and PPP-11 were image-wise exposed at a range of energy densities with a Creo Trendsetter, as defined in Example 1. The image-wise exposed precursors were then developed by dipping the precursors in the Energy Elite Improved Developer™ THD200 commercially available from AGFA Graphics NV, at a temperature of 25° C. during a dwell time of 40 s.

Plate Sensitivity Test

The sensitivity of the obtained printing plates PP-10 and PP-11 was determined following the method defined in Example 1. The results for the sensitivity are given in Table 12.

TABLE 12

Sensitivity results

| Printing plate | Sensitivity mJ/cm$^2$ |
|---|---|
| PP-10, Comparative | 245 |
| PP-11, Inventive | 187 |

The results in Table 12 demonstrate that the printing plate including the resin according to preferred embodiments of the present invention PP-11 exhibits an improved sensitivity in comparison with the comparative Example PP-10 which does not contain a resin of the present invention.

The invention claimed is:

1. A copolymer comprising:
a plurality of ethylenic moieties A including a structure according to the following formula:

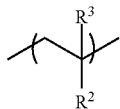

wherein $R^2$ and $R^3$ independently represent hydrogen; and
a plurality of acetal moieties B including a structure according to the following formula:

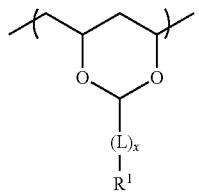

wherein L is a divalent linking group;
X=0 or 1; and
$R^1$ represents an optionally substituted aromatic or heteroaromatic group including at least one hydroxyl group.

2. The copolymer according to claim 1, wherein an amount of the plurality of ethylenic moieties A is in a range of 10 to 55 mol %.

3. The copolymer according to claim 1, wherein an amount of the plurality of acetal moieties B is in a range of 15 to 60 mol %.

4. The copolymer according to claim 1, further comprising one or more optionally substituted vinyl alcohol moieties C and/or one or more moieties D represented by the following formula:

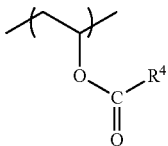

wherein $R^4$ represents hydrogen, an optionally substituted linear, branched, or cyclic alkyl group, an optionally substituted aromatic group, or an optionally substituted heteroaromatic group.

5. The copolymer according to claim 4, wherein the copolymer is represented by the following formula:

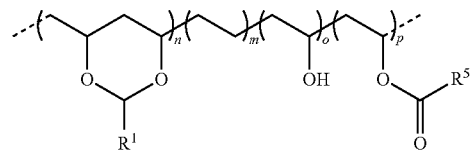

wherein $R^5$ is an optionally substituted alkyl group;
m is in a range of 10 to 55 mol %;
n is in a range of 15 to 60 mol %;
o is in a range of 10 to 60 mol %; and
p is in a range of 0 to 10 mol %.

6. The copolymer according to claim 1, wherein $R^1$ represents a phenyl, naphtyl, anthracenyl, phenanthrenyl, furyl, pyridyl, pyrimidyl, pyrazoyl, or thiofenyl group and/or combinations thereof, and the group includes at least one hydroxyl group and optionally other substituents.

7. The copolymer according to claim 1, wherein $R^1$ represents an optionally substituted phenol or naphthol group.

8. The copolymer according to claim 1, wherein $R^1$ represents an optionally substituted 2-, 3- or 4-hydroxyphenyl group, an optionally substituted 2,3-, 2,4-, or 2,5-dihydroxyphenyl group or an optionally substituted 1,2,3-trihydroxyphenyl group.

9. The copolymer according to claim 5, wherein $R^5$ represents a methyl group.

10. A positive working lithographic printing plate precursor comprising:
a support including a hydrophilic surface or a hydrophilic layer; and
a heat- and/or light-sensitive coating provided on the support; wherein
the coating includes a copolymer as defined in claim 1.

11. The precursor according to claim 10, wherein the coating further comprises a phenolic resin selected from a novolac, a resol, or a polyvinylphenolic resin.

12. The precursor according to claim 10, wherein the coating includes:
a first layer including a binder including a sulfonamide group, an imide group, a nitrile group, a urea group, a carboxyl group, a sulfonic acid group, and/or a phosphoric acid group; and
a second layer, located above the first layer, including the copolymer.

13. The precursor according to claim 12, wherein the first layer includes a binder including a sulphonamide group.

14. The precursor according to claim 10, wherein the coating includes:
a first layer including the copolymer; and
a second layer, located above the first layer, including a phenolic resin selected from a novolac, a resol, or a polyvinylphenolic resin.

* * * * *